US008643226B2

(12) United States Patent
Sakai

(10) Patent No.: US 8,643,226 B2
(45) Date of Patent: Feb. 4, 2014

(54) LINEAR MOTOR AND ELECTRONIC COMPONENT TRANSFER DEVICE EQUIPPED WITH LINEAR MOTOR UNIT

(75) Inventor: Kiyotaka Sakai, Shizuoka (JP)

(73) Assignee: Yamaha Hatsudoki Kabushiki Kaisha, Shizuoka-Ken (JP)

( * ) Notice: Subject to any disclaimer, the term of this patent is extended or adjusted under 35 U.S.C. 154(b) by 428 days.

(21) Appl. No.: 12/921,660

(22) PCT Filed: Mar. 25, 2009

(86) PCT No.: PCT/JP2009/055923
§ 371 (c)(1),
(2), (4) Date: Sep. 9, 2010

(87) PCT Pub. No.: WO2009/119648
PCT Pub. Date: Oct. 1, 2009

(65) Prior Publication Data
US 2011/0025137 A1  Feb. 3, 2011

(30) Foreign Application Priority Data

Mar. 28, 2008  (JP) .................................. 2008-087999

(51) Int. Cl.
*H02K 41/03* (2006.01)
(52) U.S. Cl.
USPC .................. 310/12.13; 310/12.19; 310/68 B; 310/12.04
(58) Field of Classification Search
USPC ............. 310/12.01–12.34, 68 B; 414/225.01, 414/737, 752.1
See application file for complete search history.

(56) References Cited

U.S. PATENT DOCUMENTS

| 6,426,573 | B1* | 7/2002 | Hwang et al. | 310/12.04 |
| 2002/0178578 | A1* | 12/2002 | Okamoto et al. | 29/834 |
| 2007/0257564 | A1* | 11/2007 | Kitade et al. | 310/12 |
| 2008/0309260 | A1* | 12/2008 | Kanai et al. | 318/38 |

FOREIGN PATENT DOCUMENTS

| JP | 3179215 A | | 8/1991 |
| JP | 2001-105270 A | | 4/2001 |
| JP | 2003-244929 A | | 8/2003 |
| JP | 2006-067771 A | | 3/2006 |
| JP | 2006067771 A | * | 3/2006 |
| WO | WO03098782 | * | 11/2003 |

OTHER PUBLICATIONS

WO3098782 machine translation Oct. 9, 2012.*
The extended European Search Report dated Feb. 13, 2013, which corresponds to EP Application No. 09724247.3-1903 and is related to U.S. Appl. No. 12/921,660.

* cited by examiner

*Primary Examiner* — Tran Nguyen
*Assistant Examiner* — Leda Pham
(74) *Attorney, Agent, or Firm* — Studebaker & Brackett PC

(57) ABSTRACT

One aspect of the present invention relates to a linear motor unit including a plurality of linear motors, each having a stator, a movable element that linearly reciprocates along the stator, and a magnetic sensor that can detect a position of the movable element, wherein the magnetic sensors of the adjacent linear motors are disposed so as to be placed in mutually different positions in a moving direction of the movable element.

7 Claims, 13 Drawing Sheets

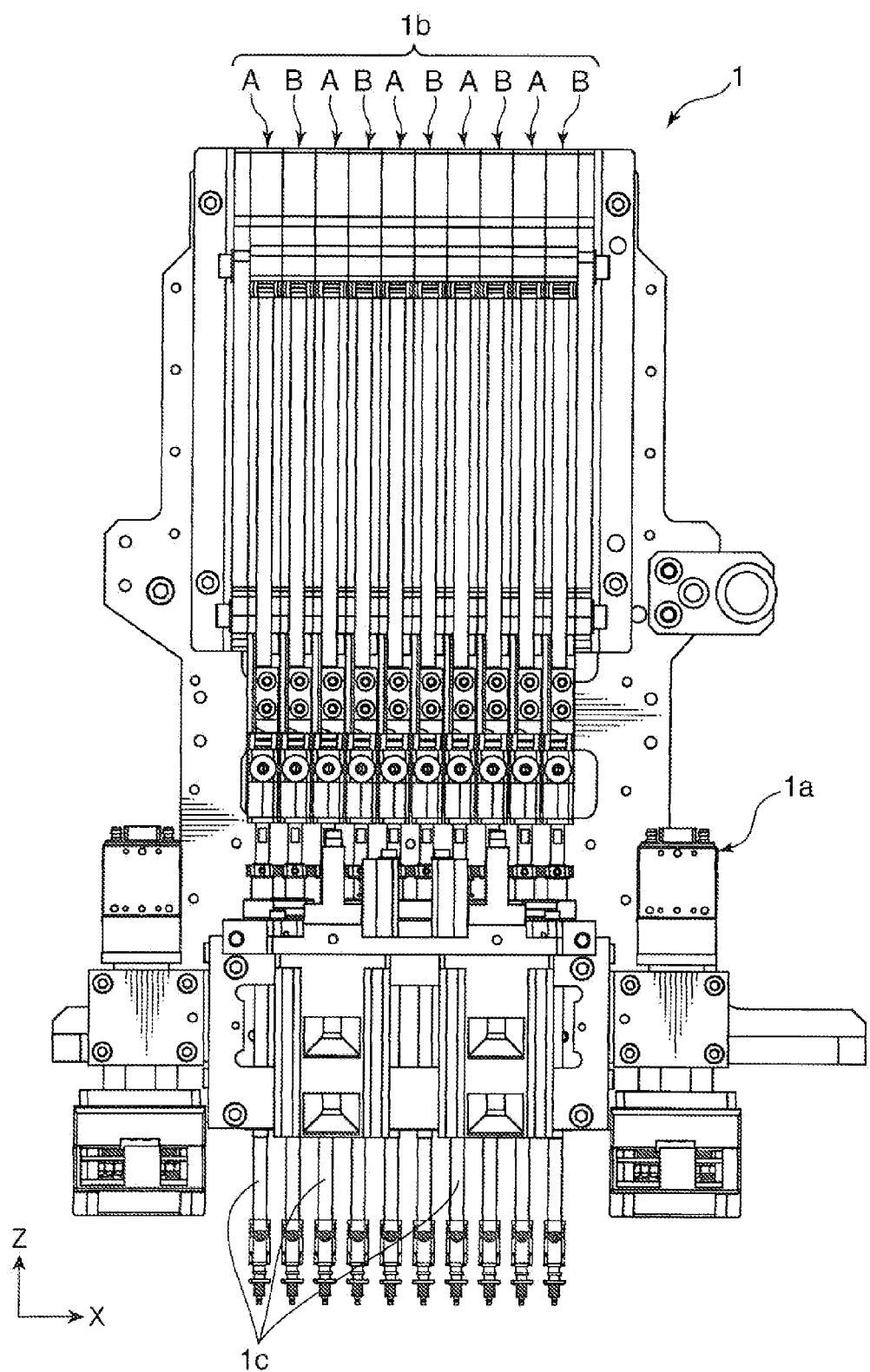

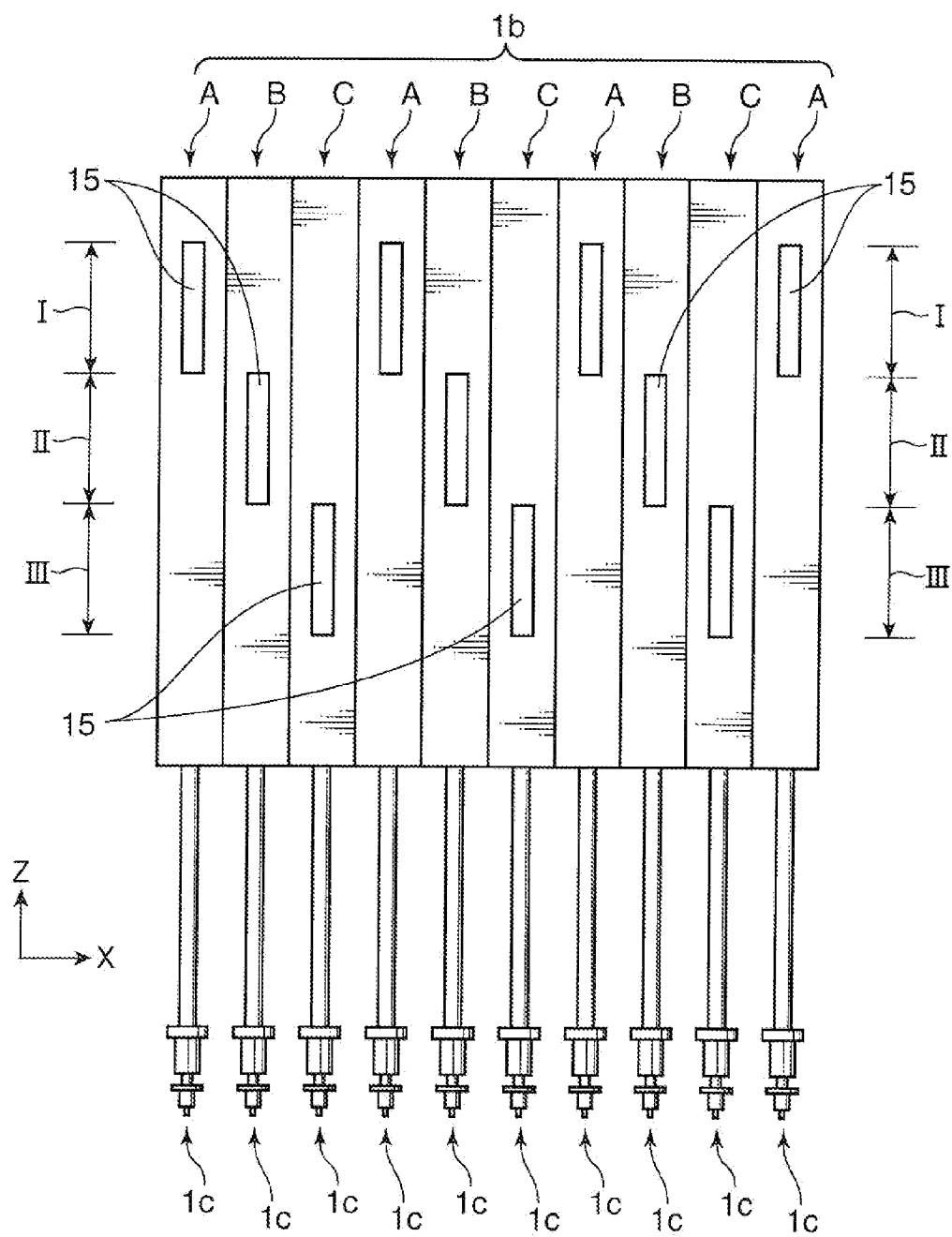

LINEAR MOTOR AND ELECTRONIC COMPONENT TRANSFER DEVICE EQUIPPED WITH LINEAR MOTOR UNIT

TECHNICAL FIELD

The present invention relates to a linear motor unit and an electronic component transfer device equipped with the linear motor unit, and more particularly to a linear motor unit that is used in a state in which it is provided with a plurality of linear motors and to an electronic component transfer device equipped with the linear motor unit.

BACKGROUND ART

A surface mounting machine and a component inspection device are provided with a head unit as an electronic component transfer device. The head unit includes a nozzle member and a means for lifting the nozzle member. The head unit being supported by a component conveying unit provided on a platform travels in the horizontal direction to hold, with the nozzle member, an electronic component that has been fed to a predetermined position. The head unit then transfers and mounts the electronic component to a predetermined position. As described in Patent Document 1, the means for lifting the head unit is in the form of a linear motor unit in which a plurality of linear motors are provided in parallel. Each linear motor has a stator, a movable element that linearly reciprocates along the stator, and a magnetic sensor that can detect the position of the movable element. Each magnetic sensor detects a transfer position of the corresponding movable element.

Patent Document 1: Japanese Patent Application Publication No. 2006-67771

DISCLOSURE OF THE INVENTION

The object of the present invention is to avoid external disturbance that would occur when magnetic sensors relating to adjacent linear motors would come close to each other.

The first aspect of the present invention relates to a linear motor unit including a plurality of linear motors. Each liner motor has a stator, a movable element that linearly reciprocates along the stator, and a magnetic sensor that can detect a position of the movable element. The magnetic sensors of the adjacent linear motors are disposed so as to be placed in mutually different positions in a moving direction of the movable element. According to this aspect, magnetic sensors relating to the adjacent linear motors are disposed so as to be placed in mutually different positions in the moving direction of the movable element, and a large opposing distance is set therebetween. Therefore, external disturbances which would occur when the magnetic sensors would come close to each other can be avoided and various inconveniences caused by the external disturbances can be prevented.

Other features and operation effects of the present invention will be made more apparent by embodiments described below in detail with reference to appended drawings.

BRIEF DESCRIPTION OF THE DRAWINGS

[FIG. 2] is a front view for explaining a head unit according to the embodiment shown in FIG. 1.

[FIG. 11] is a schematic drawing illustrating another form of a linear motor unit according to yet another embodiment of the present invention.

BEST MODE FOR CARRYING OUT THE INVENTION

The preferred embodiment of the invention will be explained below with reference to the appended drawings. The explanation below uses a three-dimensional XYZ coordinate system in which a vertical direction is represented by the Z axis.

Figure 1:
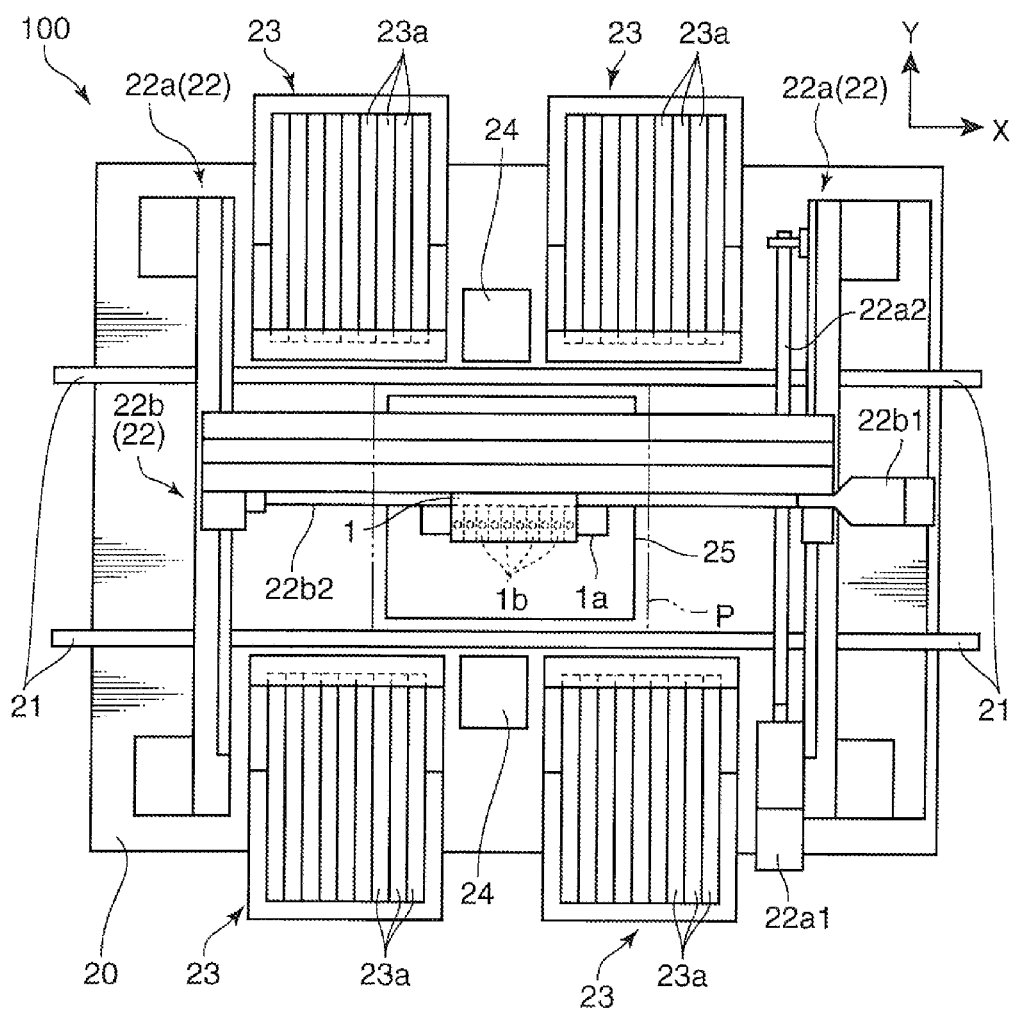
[FIG. 1] is a schematic plan view for illustrating schematically a surface mounting machine according to one embodiment of the present invention.
Figure 3A:
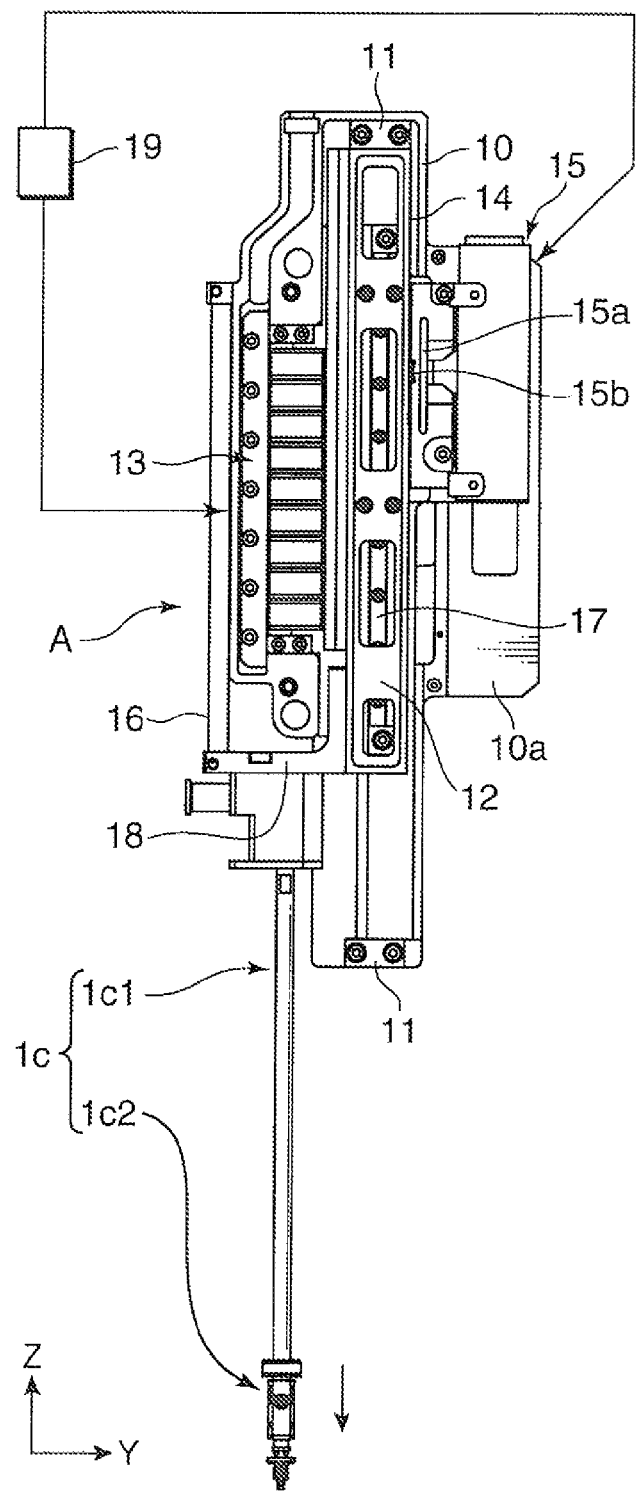
[FIG. 3A] is a view for explaining a first linear motor according to the embodiment shown in FIG. 1 and a nozzle member mounted on the first linear motor, and illustrates a state in which the nozzle member is positioned at the uppermost end.
Figure 3B:
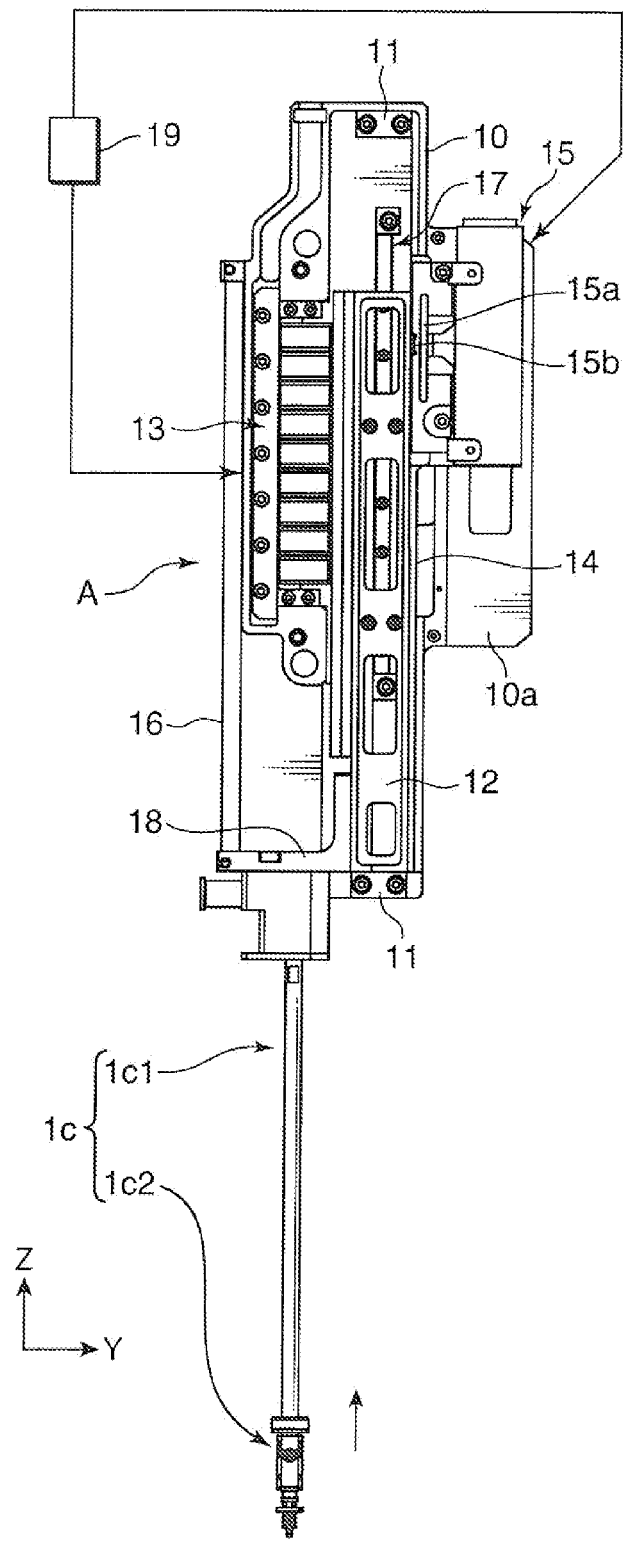
[FIG. 3B] is a view for explaining a first linear motor according to the embodiment shown in FIG. 1 and a nozzle member mounted on the first linear motor, and illustrates state in which the nozzle member is positioned at the downmost end.
Figure 4A:
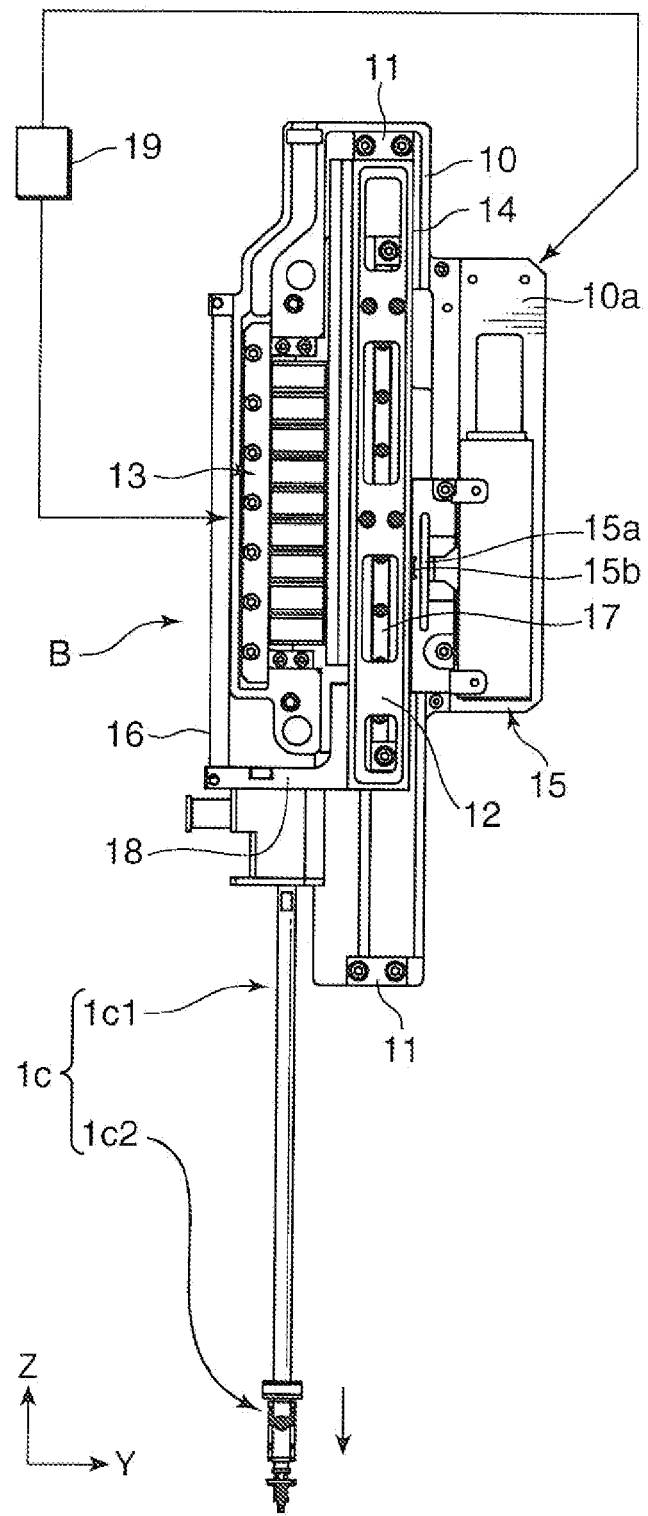
[FIG. 4A] is a view for explaining a second linear motor according to the embodiment shown in FIG. 1 and a nozzle member mounted on the second linear motor, and illustrates a state in which the nozzle member is positioned at the uppermost end.
Figure 4B:
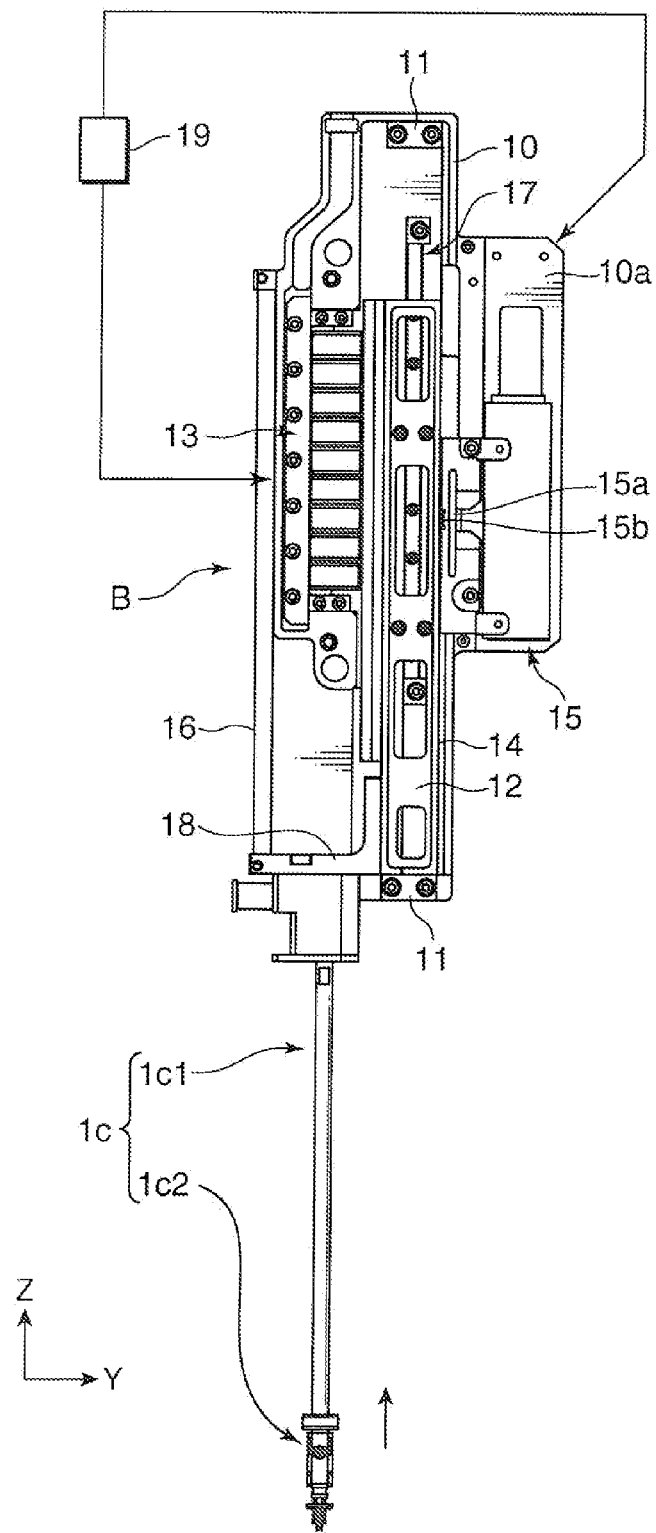
[FIG. 4B] is a view for explaining a second linear motor according to the embodiment shown in FIG. 1 and a nozzle member mounted on the second linear motor, and illustrates a state in which the nozzle member is positioned at the downmost end.

Referring to FIG. 1, a surface mounting machine 100 according to one embodiment of the present invention includes a platform 20, a conveyor 21 for board conveyance that conveys a printed board P carried to the platform 20 to a predetermined position on the platform 20, a board support device 25 that supports the printed board P conveyed by the board conveyor 21 to the predetermined position so that the board is lifted up, component feed units 23 that feed a predetermined electronic component to a predetermined position on the platform 20, a head unit 1 as an electronic component transfer device that hold the electronic component fed from the component feed units 23, a component conveying unit 22 that supports the head unit 1 so that the head unit can move in the horizontal direction, and a component image pick-up unit 24 that picks up an image of the electronic component held by the head unit 1.

The board conveyor 21 includes a pair of rails provided along the X axis direction in the figure so as to cross the platform 20, and an endless belt rotating between the rails about the Y axis. When the printed board P is carried above the platform 20, the printed board P is placed on the endless belt of the board conveyor 21 and then the printed board P is transferred to the board support device 25 at the central location on the platform 20 by rotation of the endless belt.

The board support device 25 is provided between the pair of rails of the board conveyor 21. The board support device 25 includes a lifting device, a sheet-like back-up plate provided at the upper end of the lifting device, and a plurality of back-up pins supported in a vertical state by the back-up plate. When the lifting device is driven, the back-up plate and back-up pins move upward. The distal ends of the back-up pins come into contact with the lower surface of the printed board P. The printed board P is further pushed up by the distal end of the back-up pins, until the back-up pins support the printed board P at a predetermined height correcting the deflection of the printed board P is corrected.

The component feed units 23 are in pairs and disposed outwardly so that the component feed units 23 on the platform 20 sandwich the board conveyor 21 in the Y axis direction. The component feed units 23 include a plurality of tape feeders 23a that are provided side by side in the X axis direction and have tapes fed out in the Y axis direction. Each tape feeder 23a has a reel holding unit that holds reels having the tape wound thereon and a feed-out means for feeding out the tape. A plurality of convex spaces is formed in the tape with a predetermined interval along the longitudinal direction of the tape, and an electronic component is accommodated in each space. Each reel holding unit caries reels onto which the tape is wound so that the tape can be fed out in the Y axis direction, and the component feed position is provided downstream in the feed-out direction (in the Y axis direction on the side close to the board conveyor 21). As the tape is intermittently supplied forward in the Y axis direction by the feed-out means, the electronic components are successively fed to the component feed position.

The component conveying unit 22 includes an X axis direction support unit 22b that supports the head unit 1 so that the head unit can move in the X axis direction and an Y axis direction support unit 22a that support the X axis direction support unit 22b supporting the head unit 1, such that the X axis direction support unit can move in the Y axis direction.

Where the head unit 1 holds an electronic component by suction at the component feed position of the component feed unit 23, a motor 22a1 of the Y axis support unit 22a is driven, and a ball screw shaft 22a2 receives drive power of the motor 22a1 and rotates. The X axis direction support unit 22b is linked to the ball screw shaft 22a2 via a ball nut (not shown in the figure). Therefore, the ball nut and the X axis direction support unit 22b linked to the ball nut receive the rotation of the ball screw shaft 22a2 and move in the longitudinal direction of the ball screw shaft 22a2, that is, in the Y axis direction. When the X axis direction support unit 22b reaches a predetermined position in the Y axis direction, a motor 22b1 of the X axis direction support unit 22b is driven and a ball screw shaft 22b2 receives drive power of the motor 22b1 and rotates. The head unit 1 is linked to the ball screw shaft 22b2 via a ball nut (not shown in the figure). Therefore, the ball nut and the head unit 1 linked to the ball nut receive the rotation of the ball screw shaft 22b2 and move in the longitudinal direction of the ball screw shaft 22b2, that is, in the X axis direction. Thus, the head unit 1 is supported by the X axis direction support unit 22b and the Y axis direction support unit 22a so that the head unit can move in the horizontal direction.

The component image pick-up unit 24 picks up an image of the electronic component held by the head unit 1. More specifically, the component image pick-up unit 24 includes an area camera, an illumination device, and the like and is fixed in a posture that faces up on the platform 20. In the beginning, the electronic component held by the head unit 1 is moved from a component suction position of the component feed unit 23 to a position above the component image pick-up unit 24. Then, the component image pick-up unit 24 picks up from below, an image of the electronic component held by the head unit 1.

Next, the head unit 1 and a linear motor unit 1b provided on the head unit 1 of the present embodiment will be described below in greater detail.

Referring to FIG. 2, the head unit 1 includes a board image pick-up unit 1a that picks up an image of the upper surface of the printed board P, a plurality of nozzle members 1c each of which holds the supplied electronic component by suction at the distal end thereof, and the linear motor unit 1b that will be described below in greater detail.

The board image pick-up unit 1a includes an area camera having an image pick-up element such as CCD and an illumination device. The board image pick-up unit 1a facing down is attached to the head unit 1. The board image pick-up unit 1a picks up the images of marks displayed on the surface of the printed board P.

Referring to FIGS. 3A to 4B, the nozzle member 1c is driven upwardly or downwardly by linear motors of the linear motor unit 1b and is rotated about the central axis of the nozzle by a rotation drive mechanism. The nozzle member 1c has a drive shaft 1c1 and a suction nozzle 1c2 detachably provided at the lower end of the drive shaft 1c1. The nozzle member 1c is connected to a negative pressure generating device (not shown in the figure) via an internal passage of the drive shaft 1c1 and a switching valve. When an electronic component is to be held by suction, a negative pressure is generated by the negative pressure generating device and the electronic component is held by suction at the distal end of the suction nozzle 1c2.

Figure 5:
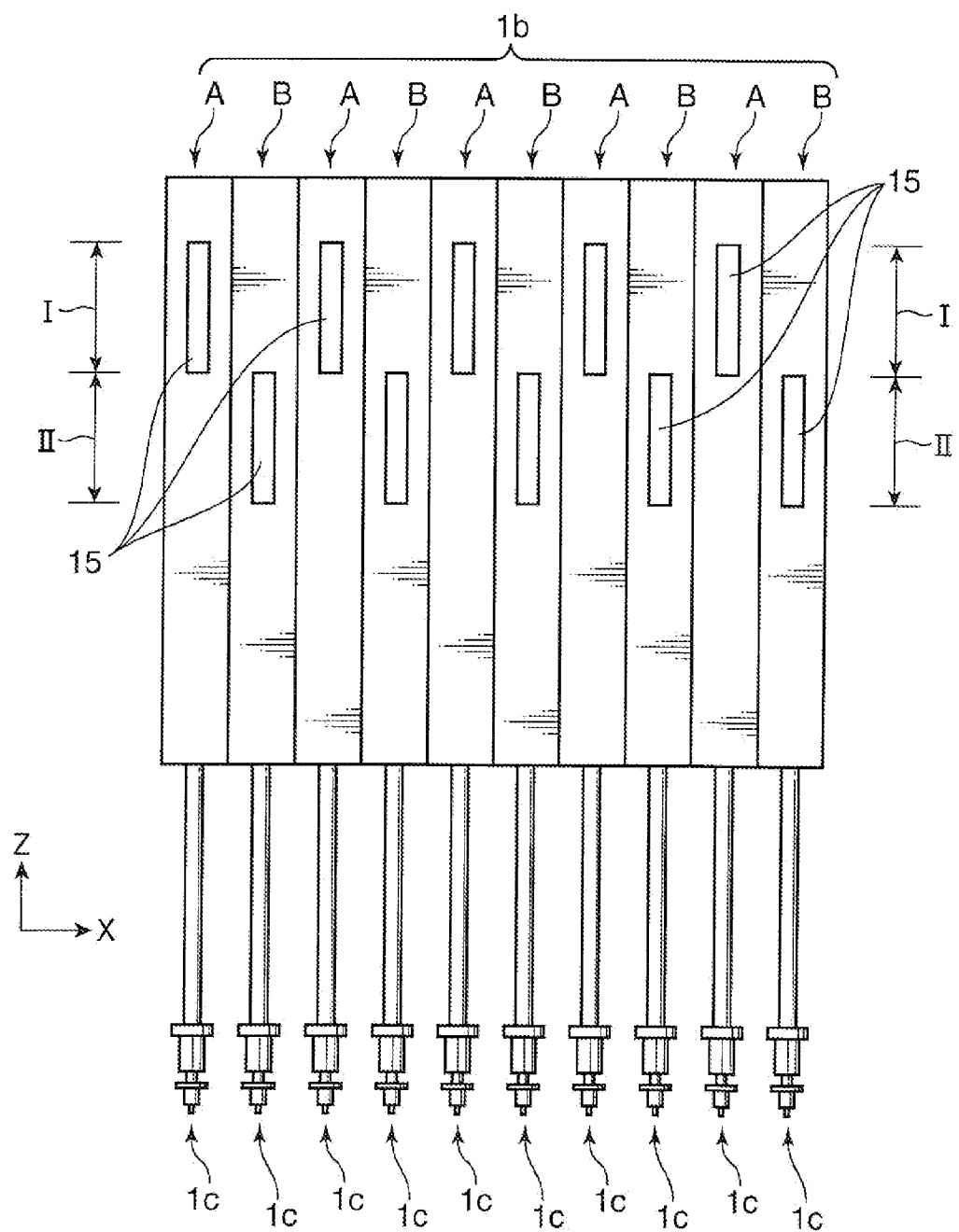
[FIG. 5] is a view for explaining schematically a linear motor unit and a nozzle member according to the embodiment shown in FIG. 1.

As will be described below in greater detail, the linear motor unit 1b according to the present embodiment includes two types of linear motors (first land second linear motors A and B) (see FIG. 5). The first and second linear motors A and B are integrated as a unit in a state of alternate arrangement and used as the linear motor unit 1b. An assembly in which one nozzle member 1c is attached to one linear motor A (B) is called a head. A plurality of heads are mounted on the head unit 1 as an integrated unit, and the head unit 1 transfers a plurality of electronic components in one cycle of reciprocating movement. In the present embodiment a total of ten heads are integrated as a unit and mounted on a head unit.

Each of the first and second linear motors A and B is provided with a frame member 10, a stator 13, a movable element 12 that linearly reciprocates along the stator 13, a linear scale 14 that is fixed to the movable element 12 and marks information specifying the position of the movable element 12, a magnetic sensor 15 that can read information marked with the linear scale 14, a return spring 16 (shape is omitted), and a control unit 19.

The frame member 10 is a member that accommodates or holds the stator 13, movable element 12, linear scale 14, magnetic sensor 15, and return spring 16. A space for accommodating the movable element 12, linear scale 14, and stator 13 is formed in the frame member 10. This space is open to allow the nozzle member 1c1 to move in the vertical direction in a state of integral attachment to the movable element 12. A linear guide 17 for guiding the movable element 12 is attached in the space of the frame member 10 so as to extend along the Z axis direction. Further, a pair of stoppers 11 that define a stroke S1 of the reciprocating movement of the movable element 12 in the Z axis direction are attached at both ends (in the Z axis direction) of the linear guide 17. A sensor fixing portion 10a for fixing the magnetic sensor 15 is provided at the frame member 10. The sensor fixing portion 10a is configured so that the magnetic sensor 15 can be displaceable in the Z axis direction or the direction parallel to the moving direction of the movable element 12, to be arranged and fixed.

The stator 13 includes a comb-shaped core, a pair of subteeth that helps to form a magnetic flux at both ends of the stator in the Z axis direction when the linear motor is driven, and a coil wound about the core. When the linear motor is driven, an electric current of any phase from among u phase, v phase, and w phase, which are mutually different phases, flows in each coil. As a result, the stator 13 is caused to function as an electromagnet and a predetermined magnetic flux is generated around each coil.

Figure 6:
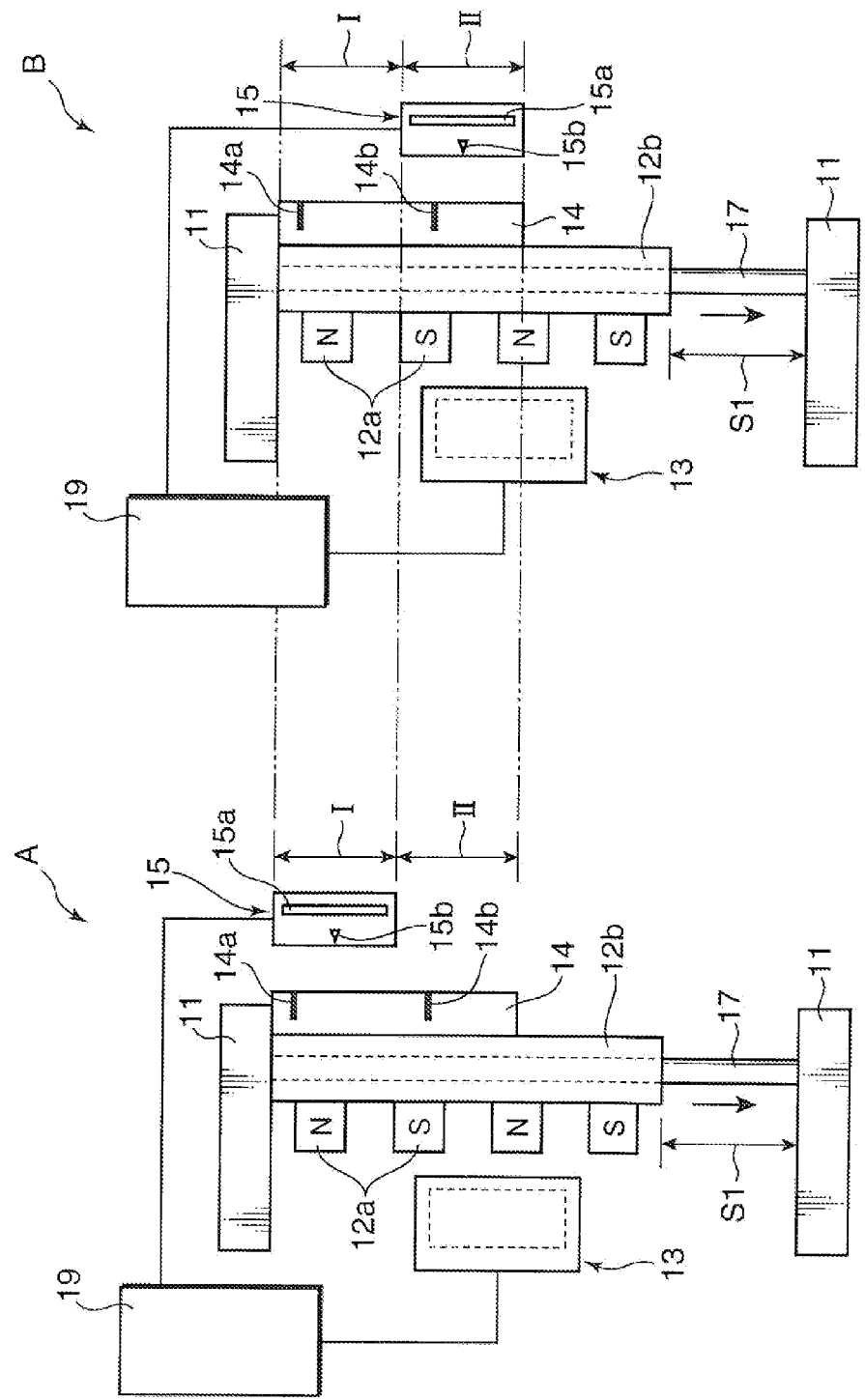
[FIG. 6] is a view for explaining schematically a first linear motor and a second linear motor according to the embodiment shown in FIG. 1.
Figure 7:
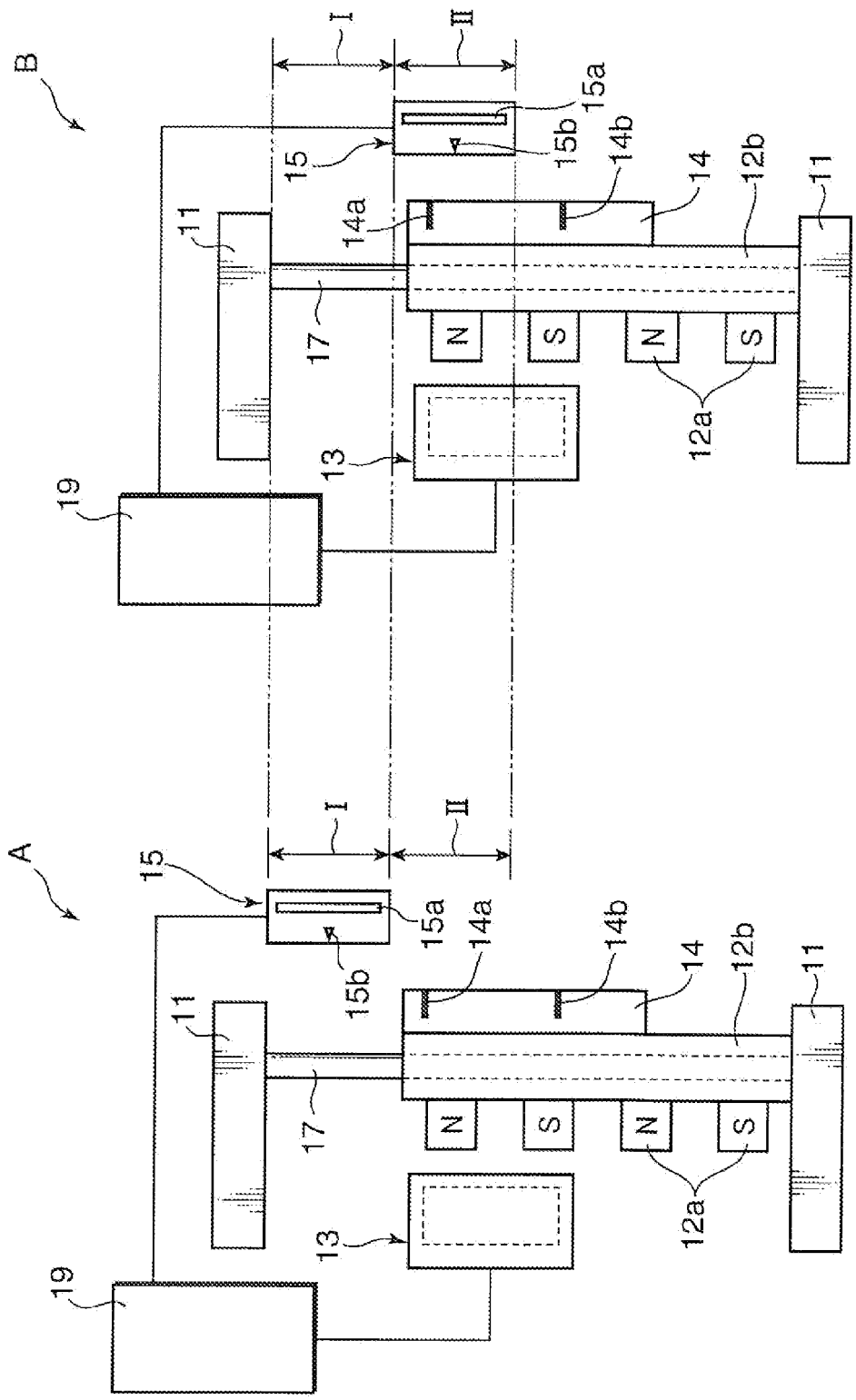
[FIG. 7] is a view for explaining schematically a first linear motor and a second linear motor according to the embodiment shown in FIG. 1.

Referring to FIGS. 6 and 7, the movable element 12 includes a movable element body 12b and permanent magnets 12a fixed to the movable element body 12b. The movable element body 12b is formed in an elongated frame-like shape with an almost U-like cross section. The permanent magnets 12a are fixed in positions of the movable element body 12b that face the stator 13, so that an S pole and an N pole are alternately displayed. Further, the nozzle member 1c is attached by an attachment arm 18 to a side surface of the lower end portion of the movable element 12 (see FIGS. 3A to 4B).

Where a predetermined electric current is supplied to the coil of the stator 13, the stator 13 functions as an electromagnet, the magnetic flux of the electromagnet interacts with the magnetic flux of the permanent magnet 12a of the movable element 12, and a propulsion force is generated. As a result, the movable element 12 reciprocates along the Z axis direction with respect to the stator 13 within the stroke S1 defined by a pair of stoppers 11. Therefore, the nozzle member 1c mounted on the movable element 12 is lifted or lowered following the displacement of the movable element 12.

The linear scale 14 is a magnetic scale on which position information is magnetically marked. More specifically, the linear scale 14 is configured such that a magnetic signal is held by using a hard, narrow elongated sheet-like magnetic material and a magnetic signal field corresponding to the magnetic signal is generated from the linear scale 14. In the present embodiment, scale information indicating a fine position with a fixed spacing along the Z axis direction and origin information indicating a calculation index mark of movement amount are recorded. The linear scale 14 is fixed with respect to the movable element 12 in a position opposite the below-described magnetic sensor 15. In the embodiment shown in FIG. 6, the linear scale 14 is used on which two pieces of the origin signal information corresponding to types of linear motors A and B is marked with a predetermined interval.

The magnetic sensor 15 is the so-called MR sensor (Magneto Resistance Sensor) and is provided with a detection element 15b that detects a magnetic signal marked with the linear scale 14 and a bias magnet 15a for preventing the noise generated in the detection process of the detection element 15b. The detection element 15b is provided with a magnetosensitive pattern facing the linear scale 14. The magnetosensitive pattern is formed by depositing a thin soft magnetic film of Permalloy or the like. It is known that if a magnetic signal field applied in substantially perpendicular to the magnetosensitive pattern when the linear scale 14 moves, the electric resistance of the magnetosensitive pattern will be slightly reduced by a magnetoresistance effect. By allowing a constant current to flow in the magnetosensitive pattern utilizing this physical phenomenon, it is possible to obtain a voltage signal corresponding to the intensity of the magnetic signal field relating to the magnetic signal marked with the linear scale 14. Suppose $\lambda$ is a pitch from the N pole to the S pole. The maximum of magnetic signal field will occur at a $\lambda/2$ position, while the minimum at a $\lambda=0$ position, that is, when N or S poles coincide. Therefore, on the linear scale 14, the magnetic signal field will change almost sinusoidally with a period of $\lambda$. Accordingly, the output of the detection element 15b will also vary with a period of $\lambda$. Where the output of the detection element 15b is subjected to an appropriate waveform processing, an electric signal corresponding to the position is obtained. Therefore, the position of the movable element 12 can be indirectly specified on the basis of the magnetic signal (scale information or origin information).

The bias magnet 15a has an approximately band-like shape. In order to avoid erroneous detection of the detection element 15b caused by the Barkhausen effect, the bias magnet 15a is arranged in a position facing the linear scale 14, such that the detection element 15b is interposed therebetween in the Y axis direction, and extended to a comparatively large length in the Z axis direction. Further, S poles and N poles are arranged opposite each other in the X axis direction so as to form a magnetic flux around the Y axis that passes through the detection element 15b.

The return spring 16 is in the form of a tension coil spring extending in the Z axis direction and mounted between the upper portion of the frame member 10 and the attachment arm 18 provided below the movable element 12. The return spring 16 biases the movable element 12 upwardly. When the movable element 12 moves downward, the nozzle member 1c descends against the biasing force of the return spring 16, and when the movable element 12 moves upward, the nozzle member 1c receives the biasing force of the return spring 16 and ascends.

The control unit 19 is provided with a current control unit (not shown in the figure), a position signal information detection unit (not shown in the figure), and an origin signal information detection unit (not shown in the figure). The current control unit controls the electric current supplied to the electromagnet of the below described stator 13 correspondingly to the relative positions between the electromagnet of the stator 13 and the permanent magnet of the movable element 12. The position signal information detection unit measures the movement amount of the movable element 12 on the basis of the detection signal of the magnetic sensor 15. The origin signal information detection unit detects the origin position for the measurement the movement amount of the movable element 12 on the basis of the detection signal of the magnetic sensor 15.

The difference between the first and second linear motors A and B will be explained below.

The difference between the first and second linear motors A and B is in the arrangement of (the bias magnets 15a of) the magnetic sensors 15. As shown in FIG. 5, the magnetic sensors 15 in the first linear motors A are disposed in a first region I, whereas, the magnetic sensors 15 in the second linear motors B are disposed in a second region II, rather than in the first region I. The first and second regions I and II are set in series in the Z axis direction. Therefore, when the magnetic sensors 15 are disposed in the respective regions, the bias magnets 15a located in the magnetic sensors 15 do not overlap each other in the moving direction. If the first and second linear motors A and B are arranged alternately and integrated in a unit, as shown in FIG. 5, the positions of magnetic sensors 15 in the adjacent linear motors A and B differ in the moving direction of the movable element 12, that is, in the Z axis direction. Therefore, the bias magnet 15a contained in the magnetic sensor 15 of the first linear motor A and the bias magnet 15a contained in the magnetic sensor 15 of the second linear motor B arranged adjacently to the first linear motor A have mutually different places and do not face each other in the X axis direction. For this reason, magnetic fields of the bias magnets 15a contained in the magnetic sensors 15 relating to the adjacent linear motors A and B can avoid the mutual interactions with each other.

Figure 8:
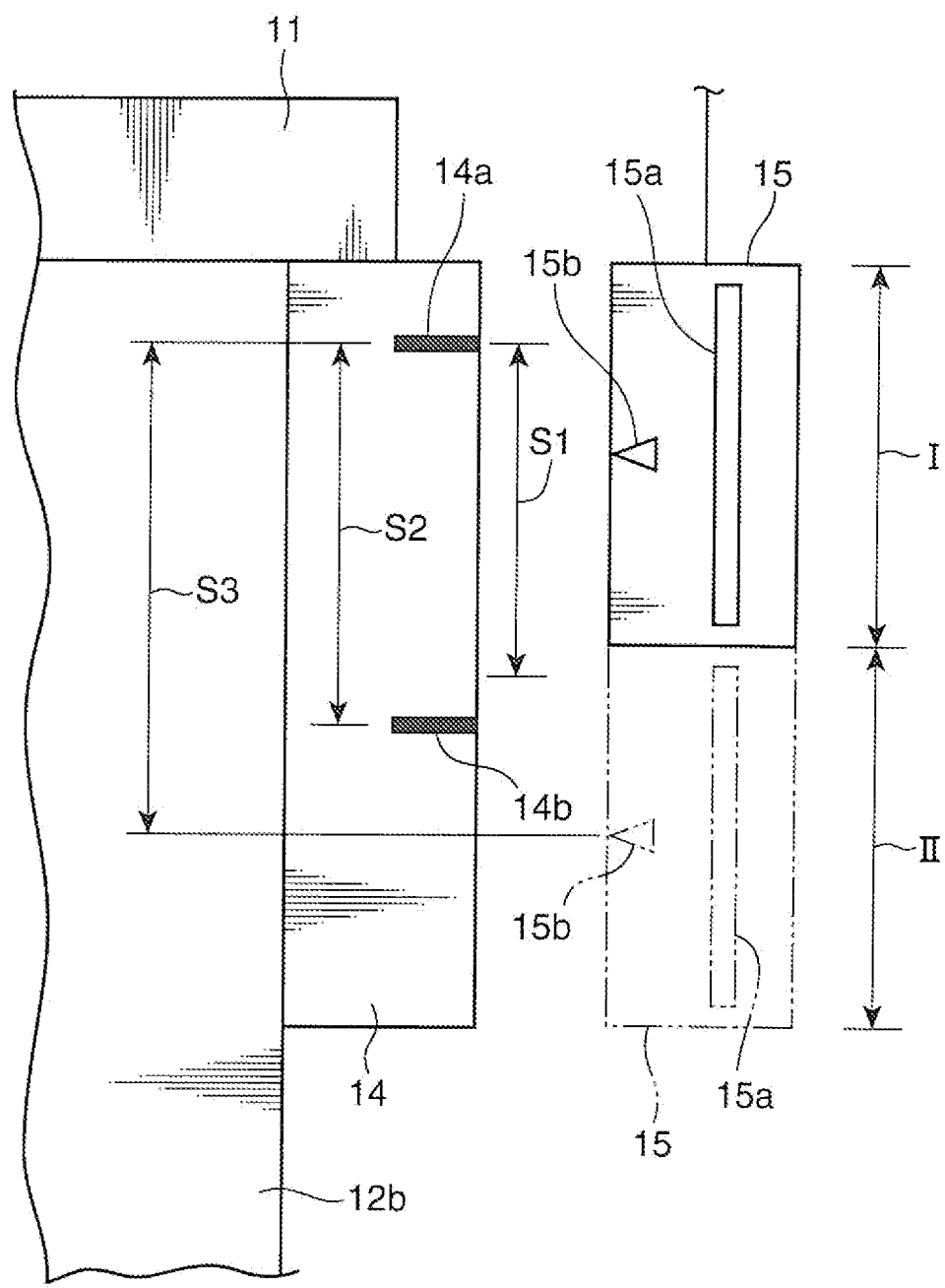
[FIG. 8] is a view for explaining the spacing of two pieces of origin signal information marked with a linear scale according to the embodiment shown in FIG. 1.

This difference between the first and second linear motors A and B will be described below in greater detail. Referring to FIGS. 6 and 7, the linear motors A and the second linear motors B shown in these figures are equipped with linear scales 14 of identical specifications, regardless of the arrangement positions of magnetic sensors 15. More specifically, first origin signal information 14a that can be read by only the magnetic sensor 15 disposed in the first region I and second origin signal information 14b that can be read by only the magnetic sensor 15 disposed in the second region II are recorded as magnetic signals in the linear scale 14. As shown in FIG. 8, a spacing S2 between the first origin signal information 14A and the second origin signal information 14b is set larger than the stroke S1 of the movable element 12 and smaller than a distance S3 from the first origin signal information 14a to the position (or reading position) of the detection element 15b of the magnetic sensor 15 (shown by virtual line in FIG. 8) of the adjacent second linear motor B. By establishing such a relationship S1<S2<S3 and maintaining a series relationship between the first and second regions I and II, the first origin signal information 14a is read by only the magnetic sensor 15 disposed in the first region I while the second origin signal information 14b is read by only the magnetic sensor 15 disposed in the second region II.

Therefore, in the first linear motors A, as shown in FIGS. 6 and 7, the first origin signal information 14a is read by the magnetic sensors 15 disposed in the first region I to control the drive of the first linear motors A. In the second linear motors B, as shown in FIGS. 6 and 7, the second origin signal information 14b is read by the magnetic sensors 15 disposed in the second region II to control the drive of the second linear motors B.

Because the origin signal information are marked at two places with a predetermined interval in the linear scale 14, the magnetic sensors 15 can read the origin signal information marked at any one of two places on each linear scale 14, even if there are differences in arrangement positions and in reading ranges of the magnetic sensors 15 on the adjacent first and second linear motors A and B. Moreover, because the linear scales 14 provided in the linear motors can be standardised to the entire linear motor unit 1b, the components can be easily managed, and the linear motors A and B can be efficiently assembled.

According to the present embodiment as described hereinabove, the bias magnet 15a in the magnetic sensor 15 is used in order to avoid erroneous detection of the detection element 15b caused by the Barkhausen effect. By the way, in a configuration in which the linear motors are arranged side by side with a pitch as small as possible, the disturbance in the magnetic force lines between the magnetic sensors of adjacent linear motors would occur, so that the function of preventing the Barkhausen effect could also be impeded. To prevent the malfunctions caused by the disturbance in magnetic force lines, the conventional devices have constraints of providing shielding members between the linear motors, or taking a considerable space between the linear motors. In the present embodiment, on the contrary, the magnetic sensors 15 of the adjacent first land second linear motors A and B are provided in the mutually different places in the moving direction (Z axis direction) of the movable element 12. In other words, with respect to the adjacent first land second linear motors A and B, the bias magnets 15a contained in the magnetic sensors 15 are arranged so as not to face each other in the X axis direction. Therefore, the disturbance in the magnetic force lines of the bias magnets 15a incorporated in the magnetic sensors 15 between the adjacent first land second linear motors A and B can be avoided and the function of preventing the Barkhausen effect can be ensured, thereby making it possible to prevent erroneous detection of the movable element 12 by the detection elements 15b.

In the linear motor unit 1b according to the embodiment illustrated by FIGS. 1 to 8, the first and second linear motors A and B that differ from each other only in the positions of magnetic sensors 15 are arranged alternately. However, the present invention is not limited to the above-described embodiment.

Figure 9:
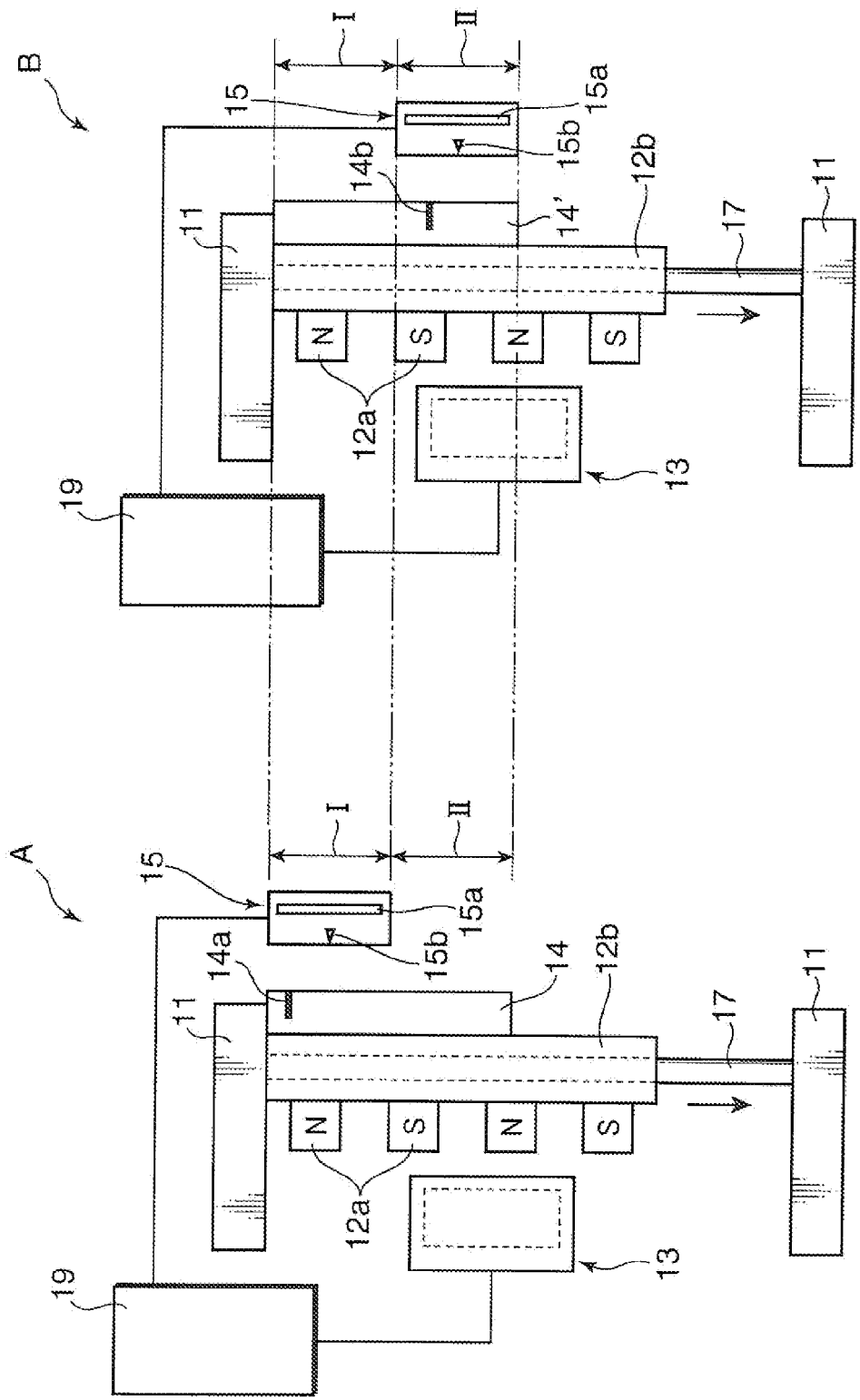
[FIG. 9] is a schematic drawing illustrating a first linear motor and a second linear motor according to another embodiment of the present invention.

For example, linear scales 14, 14' of different specifications, which mark the origin signal information at only one place, may be used for the first and second linear motors A and B, as in the linear motor unit 1b shown in FIG. 9. More specifically, one first origin signal information 14a that can be read by only the magnetic sensor 15 provided in the first region I is marked at the linear scale 14 of the first linear motor A, and one second origin signal information 14b that can be read by only the magnetic sensor 15 provided in the second region II is marked at the linear scale 14' of the second linear motor B. Therefore, in the first linear motor A, the first origin signal information 14a of the linear scale 14 is read by the magnetic sensor 15 disposed in the first region I and used to control the drive of the first linear motor A. In the second linear motor B, the second origin signal information 14b of the linear scale 14' is read by the magnetic sensor 15 disposed in the second region II and used to control the drive of the second linear motor B.

Thus, the first and second linear motors A and B, which are adjacent alternately in the linear motor unit 1b, are provided with linear scales 14, 14' of which the origin signal information are marked at respectively different positions so that each of which corresponds to the position of magnetic sensors 15. In other words, the types of linear scales to be attached to the stators 12 are different from each other according to the arrangement positions of the magnetic sensors 15 in respective first and second linear motors A and B. As a result, even if there are differences in arrangement positions and in read ranges of the magnetic sensors 15 on the adjacent first and second linear motors A and B, the origin signal information can be readable using linear scales 14, 14' each of which origin signal information is marked only one place.

Figure 10:
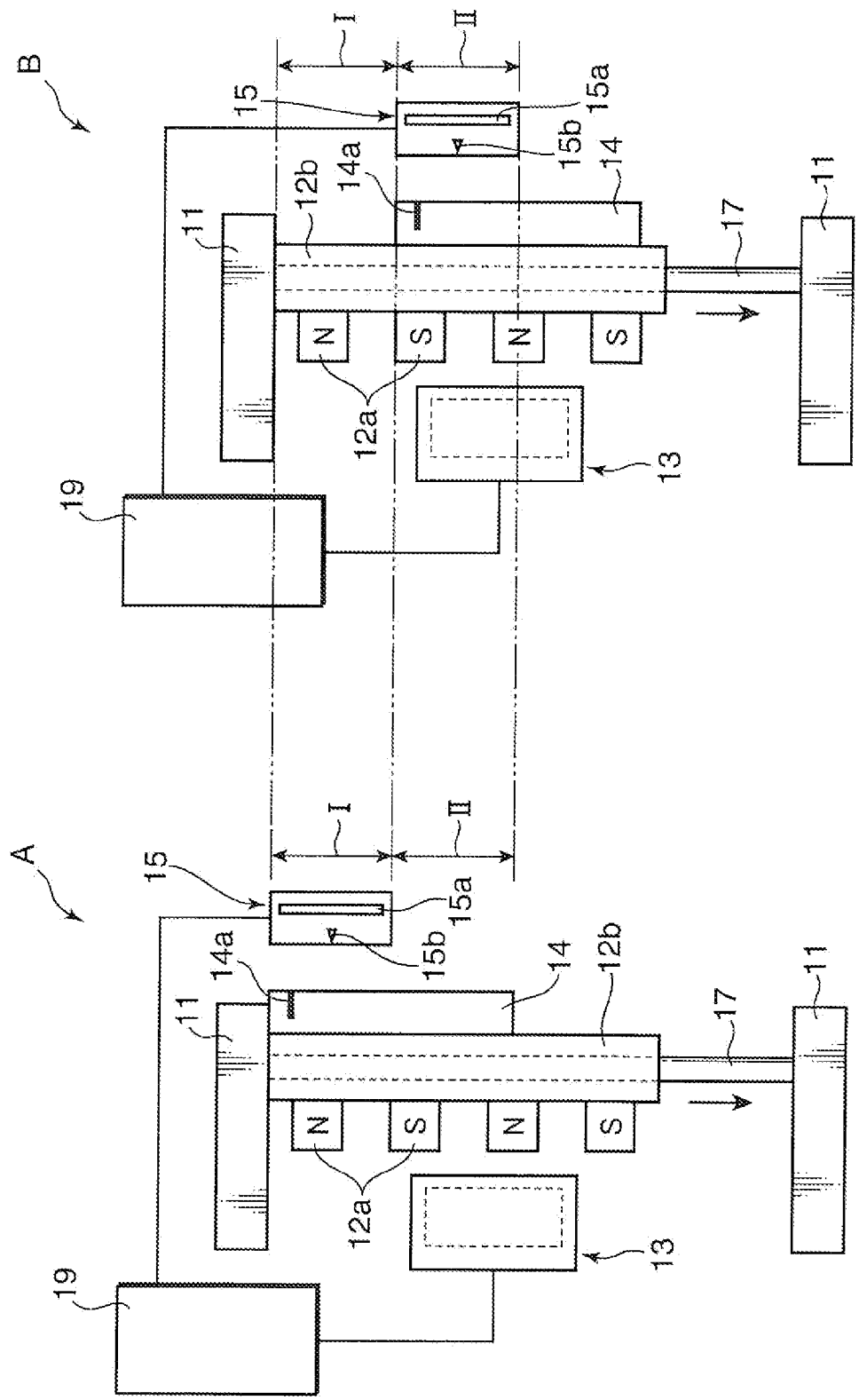
[FIG. 10] is a schematic drawing illustrating another form of a first linear motor and a second linear motor according to yet another embodiment of the present invention.

In another possible configuration, as shown in FIG. 10, pasting positions of the linear scale 14 with respect to the movable element 12 in the first and second linear motors A and B are shifted with respect to each other in the Z axis direction and the first origin signal information 14a is read by the magnetic sensor 15.

As another linear motor unit 1b as shown in FIG. 11, the configuration may have three or more linear motors (in FIG. 11, a first linear motor A, a second linear motor B, and a third linear motor C) with different positions of the magnetic sensors 15 so that adjacent types thereof differ from each other.

To read the origin signal information by the magnetic sensor 15 in FIG. 11, the linear scale may have the origin signal information marked at three different places spaced with predetermined interval therebetween, or one single place corresponding to the arrangement position of the magnetic sensor 15.

Any of the above-described linear motor units can be applied to the surface mounting machine explained with reference to FIG. 1. Further, not only the surface mounting machine, but also a component inspection device or a dispenser may be installed as the component transfer device.

The explanations of the present embodiment was related to a configuration in which one magnetic sensor 15 was disposed for one linear motor. The present invention is, however, not limited to this configuration. The present invention can also be applied in the case of a linear motor unit in which a plurality of magnetic sensors are disposed for one linear motor. In such a case, magnetic sensors of linear motors adjacent in the linear motor unit may be disposed so that the magnetic sensors do not overlap in the moving direction (Z axis direction) of the movable element.

Accordingly, a linear motor unit in accordance with the present invention is provided with a plurality of linear motors, each having a stator, a movable element that linearly reciprocates along the stator, and a magnetic sensor that can detect a position of the movable element, wherein the magnetic sensors of the adjacent linear motors are disposed so as to be placed in mutually different positions in a moving direction of the movable element. In accordance with the present invention, magnetic sensors relating to the adjacent linear motors are disposed so as to be placed in mutually different positions in the moving direction of the movable element, and a large opposing distance is set therebetween. Therefore, external disturbances which would occur when the magnetic sensors would come close to each other can be avoided and various inconveniences caused by the external disturbances can be prevented.

In a preferred embodiment, the linear motor unit in accordance with the present invention includes a linear scale that is fixed to the movable element and storing information specifying a position of the movable element, wherein the linear scale has origin signal information indicating an index mark, the origin signal information is marked at least two places with a predetermined interval therebetween. Because the origin signal information are marked at least two places with a predetermined interval in the linear scale in such an embodiment, each of the magnetic sensors can read the origin signal information marked at any one of two places on each linear scale, even if there are differences in the arrangement positions and in the reading ranges of the magnetic sensors on the adjacent first linear motors. Moreover, the linear scales provided in the linear motors can be standardised to the entire linear motor unit, the components can be easily managed, and the linear motors can be efficiently assembled.

In a preferred embodiment, the linear motor unit in accordance with the present invention includes a linear scale that is fixed to the movable element and storing information specifying a position of the movable element, wherein the linear scale has origin point signal information indicating an index mark, the origin point signal information is marked at one predetermined place, and wherein the origin signal information of the adjacent linear motors are marked at mutually different places so that each of which corresponds to the position of the magnetic sensor. In such an embodiment, the adjacent linear motors are provided with linear scales of which the origin signal information are marked at respectively different positions. In other words, the types of linear scales to be attached to the stators are different from each other according to the arrangement positions of the magnetic sensors in respective linear motors. As a result, even if there are differences in arrangement positions and in read ranges of the magnetic sensors on the adjacent linear motors, the origin signal information can be readable using linear scales each of which origin signal information is marked only one place.

In a preferred embodiment, the linear motors are classified into a plurality of types on a basis of attachment positions of the magnetic sensors, and linear motors of different types are arranged alternately in a predetermined sequence. In this embodiment, because the liner motors of a plurality of types are arranged alternately in order to differ the positions of magnetic sensors from each other, external disturbances that would occur when adjacent magnetic sensors in linear motors of a limited number of types would come close to each other can be avoided. As a result, linear motors of a limited number of types can be assembled in a simple manner and a linear motor unit with high resistance to the effect of external disturbances can be readily created.

In a preferred embodiment, the linear motor unit in accordance with the present invention includes a linear scale that is fixed to the movable element, and the origin signal information marked at a plurality of places with an interval therebetween so that every linear motor of plural types identifies only one index mark. In such an embodiment, Because a general-purpose linear scale can be obtained, the components can be easily managed and the linear motors can be assembled with good efficiency.

In a preferred embodiment, the magnetic sensors have respective bias magnets that prevent a Barkhausen effect, and the bias magnets are disposed so as to be placed in mutually different positions in a moving direction of the movable element. In such an embodiment, erroneous detection of magnetic sensors caused by the Barkhausen effect can be prevented by providing the bias magnets. Furthermore, the disturbance in the magnetic force lines of the bias magnets which would occur when bias magnets in adjacent liner motors would come close to each other can be prevented. Therefore, the disturbance in the magnetic force lines can be avoided and the function of preventing the Barkhausen effect can be ensured, thereby making it possible to prevent erroneous detection by the magnetic sensors.

An electronic component transfer device in accordance with the present invention holds a supplied electronic component, moves the electronic component to a predetermined position, and places the electronic component to the predetermined position, the electronic component transfer device including: a linear motor unit provided with a plurality of linear motors, each having a stator, a movable element that linearly reciprocates along the stator, and a magnetic sensor that can detect a position of the movable element, the magnetic sensors of the adjacent linear motors being disposed so as to be placed in mutually different positions in a moving direction of the movable element; and a nozzle member integrally mounted on the movable element of each of the linear motors of the linear motor unit, vertically reciprocating as the movable element moves, and holding the electronic component. According to this invention, by providing the electronic component transfer device with above-described linear motor unit, it is possible to avoid external disturbances that would occur when adjacent magnetic sensors would come close to each other and to prevent erroneous position detection of the movable element. Therefore, even in an electronic component transfer device provided with a plurality of nozzle members brought close to each other to improve mounting efficiency, the position of the movable element can be accurately detected without being affected by external disturbances that would occur when adjacent magnetic sensors would come close to each other, and damage of electronic components that would occur if the electronic components would be pressed by excess force when being held or placed by the nozzle members attached to the movable element can be avoided.

The invention claimed is:

1. A linear motor unit comprising:
a plurality of linear motors,
each of said plurality of linear motors having
a stator,
a movable element that linearly reciprocates along the stator in a moving direction,
a magnetic sensor that detects a position of the movable element, said magnetic sensor is displaceable along said moving direction of the movable element, and
a frame member including a sensor fixing portion which fixes said magnetic sensor at a position along said moving direction of the movable element; said frame member accommodates the stator, the movable element, and the magnetic sensor;
wherein the linear motors are arranged so that each of the frame members aligns at a same position with respect to said moving direction, and
the magnetic sensors of the adjacent linear motors are disposed so as to be placed in mutually different positions with respect to said moving direction of the movable element.

2. The linear motor unit according to claim 1, comprising
a linear scale that is fixed to the movable element and storing information specifying a position of the movable element,
wherein the linear scale has origin signal information indicating an index mark, the origin signal information is marked at least two places with a predetermined interval therebetween along said moving direction.

3. The linear motor unit according to claim 1, comprising
a linear scale that is fixed to the movable element and storing information specifying a position of the movable element,
wherein
the linear scale has origin point signal information indicating an index mark, the origin point signal information is marked at one predetermined place, and
wherein the origin signal information of the adjacent linear motors are marked at mutually different places so that each of which corresponds to the position of the magnetic sensor.

4. The linear motor unit according to claim 1,
wherein the linear motors are classified into a plurality of types on a basis of attachment positions of the magnet sensors, and linear motors of different types are arranged alternately in a predetermined sequence.

5. The linear motor unit according to claim 4, comprising
a linear scale that is fixed to the movable element, and the origin signal information marked at a plurality of places with an interval therebetween so that every linear motor of plural types identifies only one index mark.

6. The linear motor unit according to claim 1,
wherein the magnetic sensors have respective bias magnets that prevent a Barkhausen effect, and the bias magnets are disposed so as to be placed in mutually different positions in a moving direction of the movable element.

7. An electronic component transfer device that holds a supplied electronic component, moves the electronic component to a predetermined position, and places the electronic component to the predetermined position, the electronic component transfer device comprising:
a linear motor unit including a plurality of linear motors, each of said plurality of linear motors having a stator, a movable element that linearly reciprocates along the stator in a moving direction, a magnetic sensor, displaceable along said moving direction, that detects a position of the movable element, and a frame member including a sensor fixing portion which fixes the magnetic sensor at a position along said moving direction, said frame member accommodates the stator, the movable element, and the magnetic sensor;
wherein said linear motors are arranged so that each of the frame members aligns at a same position with respect to said moving direction;
the magnetic sensors of the adjacent linear motors being disposed so as to be placed in mutually different positions with respect to said moving direction of the movable element; and
a nozzle member integrally mounted on the movable element of each of the linear motors of the linear motor unit, vertically reciprocating as the movable element moves, and holding the electronic component.

* * * * *